United States Patent
Koizumi et al.

(10) Patent No.: US 7,391,263 B2
(45) Date of Patent: Jun. 24, 2008

(54) OPERATIONAL AMPLIFIER

(75) Inventors: Masayuki Koizumi, Kanagawa-ken (JP); Hiroyuki Shibayama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 11/511,333

(22) Filed: Aug. 29, 2006

(65) Prior Publication Data

US 2007/0057724 A1   Mar. 15, 2007

(30) Foreign Application Priority Data

Aug. 30, 2005   (JP)   ............................. 2005-249442

(51) Int. Cl.
*H03F 3/45*   (2006.01)
(52) U.S. Cl. ...................... 330/253; 330/261
(58) Field of Classification Search .................. 330/69, 330/252, 253, 261

See application file for complete search history.

(56) References Cited

U.S. PATENT DOCUMENTS 7,042,289 B2 *   5/2006   Hwang et al. ............... 330/253

FOREIGN PATENT DOCUMENTS

JP   2000-278053   10/2000

OTHER PUBLICATIONS

R. Jacob Baker, et al., Circuit Design, Layout, and Simulation, IEEE Press Series on Microelectronic Systems, pp. 96-99.

* cited by examiner

*Primary Examiner*—Khanh V Nguyen
(74) *Attorney, Agent, or Firm*—Oblon, Spivak, McClelland, Maier & Neustadt, P.C.

(57) ABSTRACT

An operational amplifier 1 is provided with differential amplifier 2, replica amplifier 3, voltage-current converting circuit 4, reference current source 5 and comparator 6. Differential amplifier 2 includes P-channel MOS transistors PT1 and PT2, gate and drain electrodes of which are connected to each other to function as loads, and N-channel MOS transistors NT1, NT2 and NT3. Replica amplifier 3 is identical in structure to differential amplifier and also includes P-channel MOS transistors PT11 and PT12, gate and drain electrodes of which are connected to each other to function as loads, and N-channel MOS transistors NT11, NT12 and NT13. Voltage-current converting circuit 4 converts output voltages of replica amplifier 3 to current Irep. Comparator 6 compares output current Irep of voltage-current converting circuit 4 with reference current Iref of reference current source 5 and supplies compared current Ico to differential amplifier 2 to keep bias current Ibias of differential amplifier 2 constant.

16 Claims, 5 Drawing Sheets

OPERATIONAL AMPLIFIER

CROSS-REFERENCE OF RELATED APPLICATIONS

This application is based upon and claims the benefit of priority from the prior Japanese Patent Application No. 2005-249442, filed on Aug. 30, 2005, the entire contents of which are incorporated herein by reference.

FIELD OF THE INVENTION

This invention generally relates to an operational amplifier and, more particularly, to an operational amplifier with differential amplifiers.

BACKGROUND OF THE INVENTION

Amplifiers and comparators are generally provided with differential amplifiers that receive and amplify an input signal and supply an output signal (as disclosed in Japanese Patent Publication 2000-278053, for instance). Recent development of miniaturization of semiconductor devices accelerates operation speeds of semiconductor integrated circuits. As a result, amplifiers and comparators provided with differential amplifiers also require high-speed operations.

In an attempt to comply with high-speed operations, semiconductor devices, such as MOS transistors, are provided with short gate electrodes. Production process fluctuations, however, cause dispersion of gate electrode lengths which, in turn, increases modulation effects of channel lengths. Such increase in modulation effects narrows operational ranges for input signals. Further, increase in dispersion of device elements of resistors, transistors, etc. used for loads causes decrease in margins for power supply voltage fluctuations in differential amplifiers.

SUMMARY OF THE INVENTION

Accordingly, it is an object of the present invention is to provide an operational amplifier which can suppress dispersion of element properties caused by production process fluctuations.

An embodiment of the present invention is directed to an operational amplifier provided with a differential amplifier, a replica amplifier, a voltage-current converting circuit and a bias current control circuit. The differential amplifier includes a differential pair of first and second transistors and a first current source. The first and second transistors are provided on a side of a high voltage power source and their control electrodes receive mutually reversed phase, positive and negative side input voltages, respectively. The first current source is provided between the first and second transistors and a low voltage power source to generate a first bias current. The replica amplifier includes a differential pair of third and fourth transistors and a second current source. The third and fourth transistors are provided on the side of the high voltage power source and their control electrodes receive the positive and negative side input voltages, respectively. The second current source is provided between the third and fourth transistors and the low voltage power source. The voltage-current converting circuit is supplied with positive and negative side voltages output from the replica amplifier. The voltage-current converting circuit converts the positive and negative side voltages to output currents. The bias current control circuit receives the output currents from the voltage-current converting circuit, generates a differential current between the output currents and the reference current and supplies the differential current to the first current source to control the first bias current.

Another embodiment of the present invention is directed to an operational amplifier provided with M-stage differential amplifiers, a replica amplifier, a voltage-current converting circuit and a bias current control circuit. Each of the M-stage differential amplifier, $2 \leq M$, includes a differential pair of first and second transistors and a (M−1)th stage differential amplifier circuit of which further includes a first current source. The first and second transistors are provided on a side of a high voltage power source and their control electrodes receive mutually reversed phase, positive and negative side input voltages, respectively. The first current source is provided between the first and second transistors and a low voltage power source to generate a first bias current. The replica amplifier includes a differential pair of third and fourth transistors and a second current source. The third and fourth transistors are provided on the side of the high voltage power source and their control electrodes receive the positive and negative side input voltages, respectively. The second current source is provided between the third and fourth transistors and the low voltage power source. The voltage-current converting circuit is supplied with positive and negative side voltages output from the replica amplifier. The voltage-current converting circuit converts the positive and negative side voltages to output currents. The bias current control circuit receives the output currents from the voltage-current converting circuit, generates a differential current between the output currents and the reference current and supplies the differential current to first current source to control the first bias current.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Figure 1:
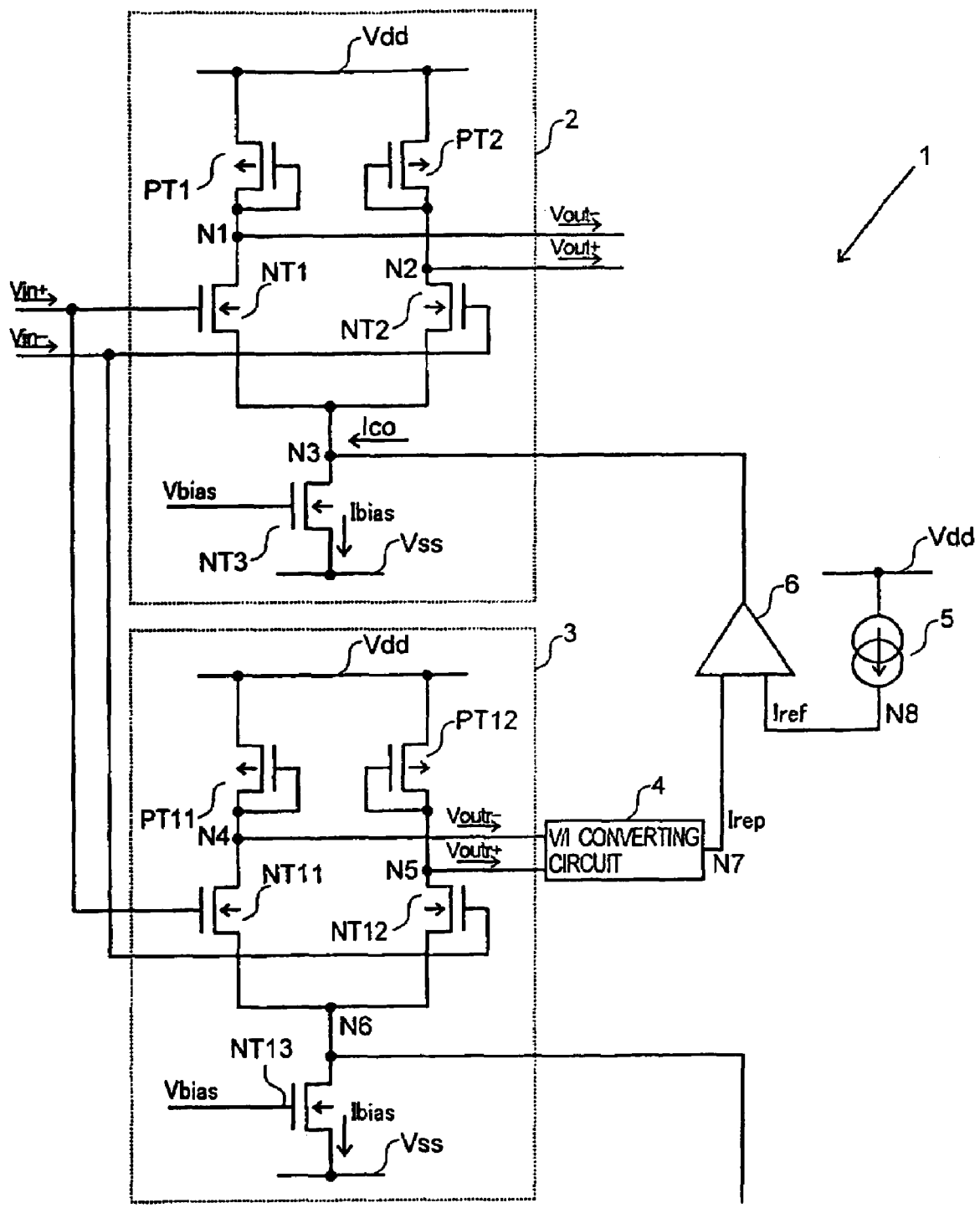
FIG. 1 is a circuit diagram of an operational amplifier in accordance with a first embodiment of the present invention.

Embodiments of the present invention will be explained below with reference to the attached drawings. It should be noted that the present invention is not limited to the embodiments but also covers their equivalents. Throughout the attached drawings, similar or same reference numerals show similar, equivalent or same components. The drawings, however, are shown schematically for the purpose of explanation, so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

First Embodiment

An operational amplifier in accordance with a first embodiment of the present invention will be explained with reference to the attached drawings. FIG. 1 shows a circuit diagram of the operation amplifier. In this embodiment, the operational amplifier includes CMOS (Complementary Metal Oxide Semiconductor) differential amplifiers.

As shown in FIG. 1, operational amplifier 1 is provided with differential amplifier 2, replica amplifier 3, voltage-current converting circuit 4, reference current source 5 and comparator 6.

Differential amplifier 2 is a one-stage amplifier composed of P-channel MOS transistors PT1 and PT2 and N-channel MOS transistors NT1, NT2 and NT3. Here, MOS transistors are also called MOSFET (Metal Oxide Semiconductor Field Effect Transistors).

P-channel MOS transistor PT1 has a source electrode, a gate electrode and a drain electrode. The source electrode is connected to high voltage power source Vdd while the gate electrode is connected to the drain electrode and node N1 and functions as a load through which N-channel MOS transistor NT1 is supplied with an electric current.

Likewise, P-channel MOS transistor PT2 has a source electrode, a gate electrode and a drain electrode. The source electrode is connected to high voltage power source Vdd while the gate electrode is connected to the drain electrode and node N2 and functions as a load through which N-channel MOS transistor NT2 is supplied with an electric current.

N-channel MOS transistor NT1 has a source electrode, a gate electrode and a drain electrode. The drain and source electrodes are connected to nodes N1 and N3, respectively. Positive side input voltage Vin+ is supplied to the gate electrode as an input signal. N-channel MOS transistor NT2 has a source electrode, a gate electrode and a drain electrode. The drain and source electrodes are connected to nodes N2 and N4, respectively. Negative side input voltage Vin− is supplied to the gate electrode as an input signal. Here, N-channel MOS transistors NT1 and NT2 constitute a differential pair in which negative side input voltage Vin− is reversed in phase with positive side input voltage Vin+.

N-channel MOS transistor NT3 has a source electrode, a gate electrode and a drain electrode. The drain and source electrodes are connected to nodes N3 and low voltage power source Vss, respectively. The gate electrode is supplied with a bias voltage from a bias circuit not illustrated in FIG. 1. Node N3 is supplied with compared current Ico from comparator 6.

Now, when the gate electrode of N-channel MOS transistor NT3 is supplied with bias voltage Vbias, N-channel MOS transistor NT3 functions as a current source that supplies bias current Ibias from node N3 through low voltage power source Vss and differential amplifier 2 operates. Differential amplifier 2 provides nodes N1 and N2 with amplified negative side output voltage Vout− and amplified positive side output voltage Vout+, respectively. Bias current Ibias is controlled and kept constant in level by compared current Ico supplied from comparator 6. Thus, comparator 6 functions as a bias current control means which provides compared current Ico and keeps bias current Ibias constant. When bias voltage Vbias is not supplied to the gate electrode of N-channel MOS transistor NT3, differential amplifier 2 stops its operation.

Replica amplifier 3 is a one-stage differential amplifier composed of P-channel MOS transistors PT11 and PT12 and N-channel MOS transistors NT11 and NT13.

P-channel MOS transistor PT11 has a source electrode, a gate electrode and a drain electrode. The source electrode is connected to high voltage power source Vdd while the gate electrode is connected to the drain electrode and node N4 and functions as a load through which N-channel MOS transistor NT11 is supplied with an electric current.

Likewise, P-channel MOS transistor PT12 has a source electrode, a gate electrode and a drain electrode. The source electrode is connected to high voltage power source Vdd while the gate electrode is connected to the drain electrode and node N5 and functions as a load through which N-channel MOS transistor NT12 is supplied with an electric current.

N-channel MOS transistor NT11 has a source electrode, a gate electrode and a drain electrode. The drain and source electrodes are connected to nodes N4 and N6, respectively. Positive side input voltage Vin+ is supplied to the gate electrode as an input signal. N-channel MOS transistor NT12 has a source electrode, a gate electrode and a drain electrode. The drain and source electrodes are connected to nodes N5 and N6, respectively. Negative side input voltage Vin− is supplied to the gate electrode as an input signal. Here, N-channel MOS transistors NT11 and NT12 constitute a differential pair.

N-channel MOS transistor NT13 has a source electrode, a gate electrode and a drain electrode. The drain and source electrodes are connected to nodes N6 and low voltage power source Vss, respectively. The gate electrode is supplied with a bias voltage from a bias circuit not illustrated in FIG. 1.

Now, when the gate electrode of N-channel MOS transistor NT13 is supplied with bias voltage Vbias, N-channel MOS transistor NT13 functions as a current source that supplies bias current Ibiasr from node N6 through low voltage power source Vss and replica amplifier 3 operates. Replica amplifier 3 provides nodes N4 and N5 with amplified negative side output voltage Voutr− and amplified positive side output voltage Voutr+, respectively. When bias voltage Vbias is not supplied to the gate electrode of N-channel MOS transistor NT13, replica amplifier 3 stops its operation.

Here, replica amplifier 3 is the same in structure as differential amplifier 2 but the gate electrode lengths and widths of the transistors in replica amplifier 3 may be different from corresponding ones in differential amplifier 2, respectively. In order to achieve high-speed operations, the gate electrodes of the transistors provided in differential amplifier 2 and replica amplifier 3 are preferably short in length. Bias current Ibiasr as well as the one Ibias are subjected in value to production process fluctuations, such as dispersion of gate electrode lengths of the transistors, but bias currents Ibiasr and Ibias are not necessarily set to be consistent in value with each other. Further, although the loads of differential amplifier 2 and replica amplifier 3 are defined by connecting the gate electrode to the drain electrode of the P-channel MOS transistors, the loads may be replaced with other elements, such as resistors, cascode-connected MOS transistors or current-mirror circuits. In addition, the loads of differential amplifier 2 are different in elements from those of replica amplifier 3. For example, the loads of differential amplifier 2 are configured by connecting the gate electrode to the drain electrode of the P-channel MOS transistors while resistors are used for those of replica amplifier 3.

Voltage-current converting circuit 4 is provided between replica amplifier 3 and comparator 6. Voltage-current converting circuit 4 receives positive side output voltage Voutr+ and negative side output voltage Voutr− from replica amplifier 3, converts the same into output current Irep, and supplies output current Irep to node N7. Here, voltage-current converting circuit 4 generates a constant current in response to values of input voltages and is preferably configured with a current-mirror circuit or a Wilson constant current circuit.

Reference current source 5 is provided between high voltage power source Vdd, generates reference current Iref and supplies the same to node N8. Here, reference current source 5 is preferably configured with a BGR (Band Gap Reference) circuit that generates a constant voltage regardless of temperature or power supply voltage fluctuation and a constant current circuit that generates a constant current in response to such a constant voltage, for example.

Comparator 6 is provided between voltage-current converting circuit 4 and differential amplifier 2, receives output currents Irep and Iref from voltage-current converting circuit 4 and reference current source 5, respectively, calculates a difference between output currents Irep and Iref, and supplies compared current Ico to node N3. For instance, when output current Irep is larger than reference current Iref, comparator 6 outputs a negatively differential current. On the other hand, when output current Irep is smaller than reference current Iref, comparator 6 outputs a positively differential current.

Now, changes of bias currents Ibias and Ibiasr and compared current Icom will be explained below in the case that common-mode input voltage Vcom of positive side input voltage Vin+ and negative side input voltage Vin− is changed.

When common-mode input voltage Vcom rises up from voltage Vcom1 by voltage $\Delta V com1$, bias current Ibias increases from current Ibias1 by current $\Delta I bias1$ while bias current Ibiasr also increases from current Ibiasr1 by current $\Delta I biasr1$, as follows:

$$Vcom = Vcom1 + \Delta Vcom1 \quad (1)$$

$$Ibias = Ibias1 + \Delta Ibias1 \quad (2)$$

$$Ibiasr = Ibiasr1 + \Delta Ibiasr1 \quad (3)$$

where voltages $\Delta Vcom1$ is an increment of common-mode input voltage Vcom, and $\Delta Ibias1$ and $\Delta Ibiasr1$ are increments of bias currents Ibias and Ibiasr, respectively.

When bias current Ibiar of replica amplifier 3 increases by current $\Delta Ibiasr1$, voltages applied to P-channel MOS transistors PT11 and PT12, i.e., the loads of replica amplifier 3, are changed to rise up. Since those voltages are monitored with voltage-current converting circuit 4, output current Irep also increases from current Irep1 by current $\Delta Irep1$ as follows:

$$Irep = Irep1 + \Delta Irep1 \quad (4)$$

where current $\Delta Vcom1$ is an increment of output current Irep.

If reference current Iref is equal to output current Irep1, then current Ico is expressed by the following:

$$Ico = -\Delta Irep1 \quad (5)$$

Where increment $\Delta Irep1$ of output current Irep is designed to be consistent with increment $\Delta Ibias1$ of bias current Ibias, only increment $\Delta Ibias1$ of bias current Ibias flows through comparator 6 to keep bias current Ibias constant even when common-mode input voltage Vcom increases from voltage Vcom1 by increment $\Delta Vcom1$. Further, where an increment of output current Irep is designed to be consistent with that of bias current Ibias, bias current Ibias is kept constant even when high voltage power source Vdd rises up.

On the other hand, when common-mode input voltage Vcom decreases from voltage Vcom1 by voltage $\Delta Vcom2$, bias current Ibias decreases from current Ibias1 by current $\Delta Ibias2$ while bias current Ibiasr also decreases from current Ibiasr1 by current $\Delta Ibiasr2$, as follows:

$$Vcom = Vcom1 - \Delta Vcom2 \quad (6)$$

$$Ibias = Ibias1 - \Delta Ibias2 \quad (7)$$

$$Ibiasr = Ibiasr1 - \Delta Ibiasr2 \quad (8)$$

where voltages $\Delta Vcom2$ is a decrement of common-mode input voltage Vcom, and $\Delta Ibias2$ and $\Delta Ibiasr2$ are decrements of bias currents Ibias and Ibiasr, respectively.

When bias current Ibiasr of replica amplifier 3 decreases by current $\Delta Ibiasr2$, voltages applied to P-channel MOS transistors PT11 and PT12, i.e., the loads of replica amplifier 3, are changed and decrease. Since those voltages are monitored with voltage-current converting circuit 4, output current Irep also decreases from current Irep1 by current $\Delta Irep2$ and can be expressed by the following:

$$Irep = Irep1 - \Delta Irep2 \quad (9)$$

where current $\Delta Vcom1$ is a decrement of output current Irep.

If reference current Iref is equal to output current Irep1, then current Ico is expressed by the following:

$$Ico = \Delta Irep2 \quad (10)$$

Where decrement $\Delta Irep2$ of output current Irep is designed to be consistent with decrement $\Delta Ibias2$ of bias current Ibias, only decrement $\Delta Ibias2$ of bias current Ibias flows through comparator 6 and can keep bias current Ibias constant even when common-mode input voltage Vcom decreases from voltage Vcom1 by increment $\Delta Vcom1$. Further, where a decrement of output current Irep is designed to be consistent with that of bias current Ibias, bias current Ibias is kept constant even when a voltage of high voltage power source Vdd decreases.

Figure 2:
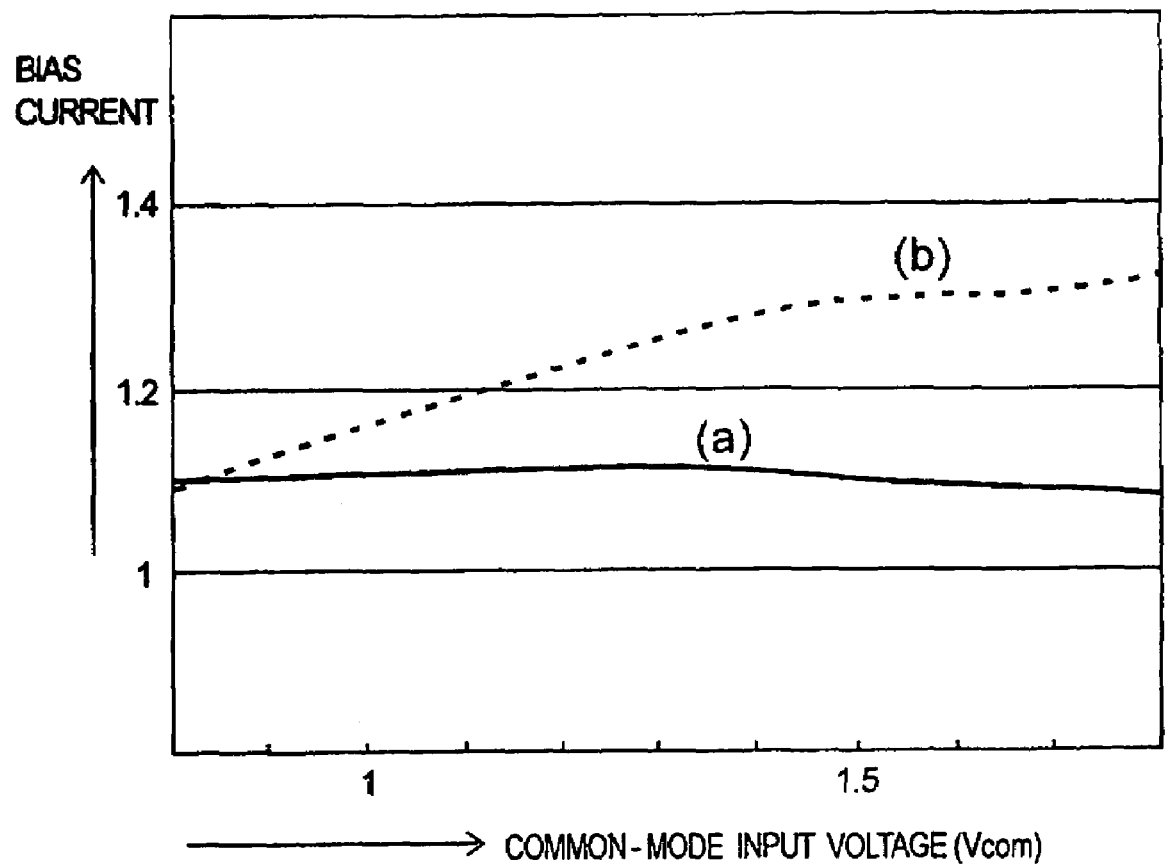
FIG. 2 is a characteristic chart to indicate relationship between a common-mode input voltage of the operational amplifier shown in FIG. 1 and a bias current thereof.
Figure 3:
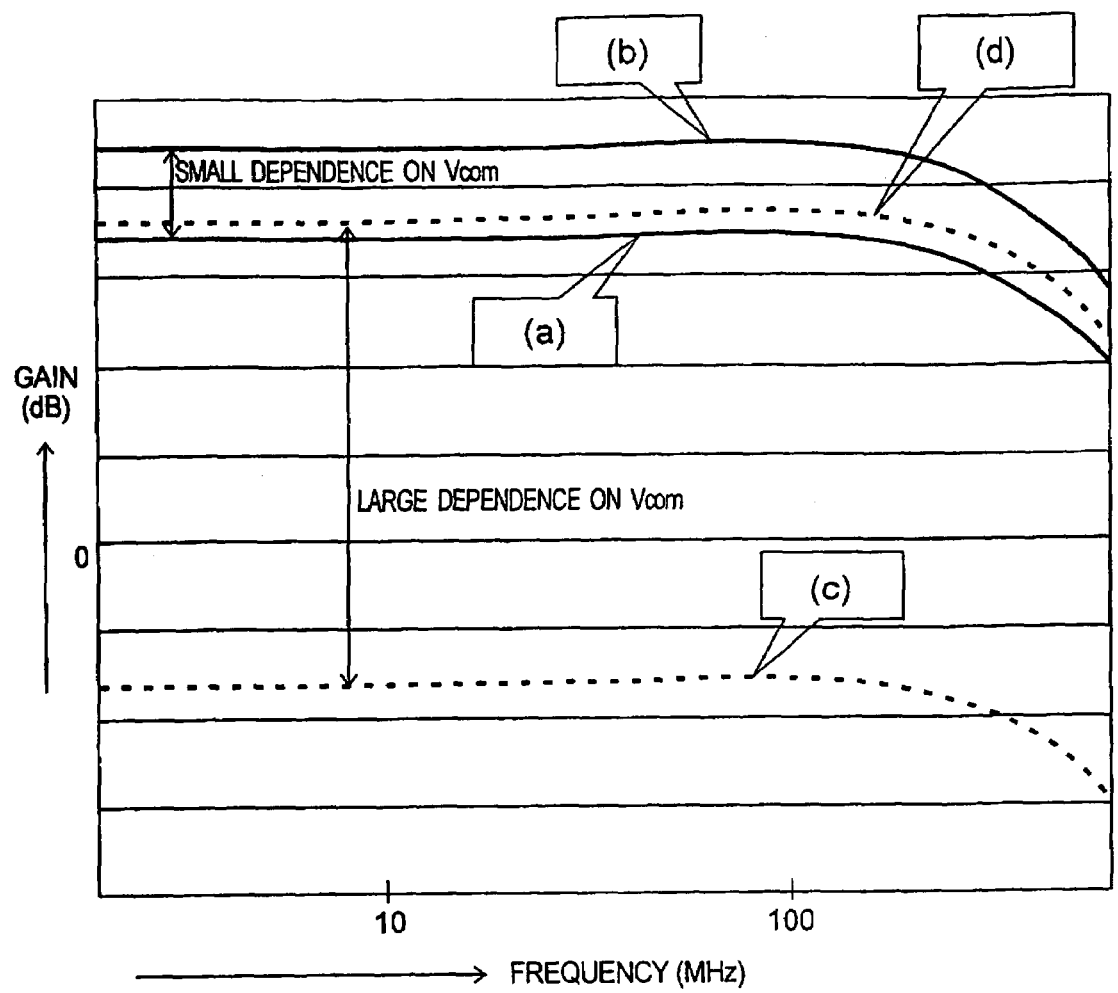
FIG. 3 is a characteristic chart to indicate gain dependence of the operational amplifier shown in FIG. 1 on the common-mode input voltage.

Next, characteristics of operational amplifiers will be explained below with reference to FIGS. 2 and 3. FIG. 2 shows a relationship between common-mode input voltage Vcom and bias current Ibias of operational amplifiers in which solid and dotted lines (a) and (b) exhibit characteristics of an amplifier of the first embodiment of the present invention and a prior art operational amplifier, respectively. The bias current indicated in FIG. 2 is normalized in value. FIG. 3 shows gain dependence on common-mode input voltages. Solid lines (a) and (b) in FIG. 3 represent the characteristics at small and large common-mode voltages of the first embodiment of the present invention, respectively. Dotted lines (c) and (d) in FIG. 3, however, represent the characteristics at small and large common-mode voltages of a prior art operational amplifier, respectively. Here, the prior art operational amplifier is such an amplifier that does not include a replica amplifier in comparison with the first embodiment of the present invention.

As shown in FIG. 2, when common-mode voltage Vcom of positive and negative side voltages Vin+ and Vin− of the prior art amplifier increases from a prescribed voltage (e.g., ordinary operative voltage of 1.5 V), a bias current flowing through the MOS transistors as current sources increases but, when common-mode voltage Vcom decreases from the prescribed voltage, a bias current flowing through the MOS transistors decreases. Thus, a tolerable range of the common-mode input voltage cannot be set to be large.

On the other hand, however, according to the first embodiment of the present invention, even when common-mode voltage Vcom of positive and negative side voltages Vin+ and Vin− of the amplifier increases from a prescribed voltage (e.g., ordinary operative voltage of 1.5 V.), only an increment of bias current Ibias is provided from node N3 of differential amplifier 2 to comparator 6 and, when common-mode voltage Vcom decreases from the prescribed voltage (e.g., ordinary operative voltage of 1.5 V.), a decrement of bias current Ibias is provided from comparator 6 to node N3 of differential amplifier 2. As a result, current flowing from N-channel MOS transistor NT3 as a current source to low voltage power source Vss can be substantially kept constant. Thus, a tolerable range of the common-mode input voltage can be set to be large.

As shown in FIG. 3, when common-mode voltage Vcom of positive and negative side voltages Vin+ and Vin− of the prior art operational amplifier changes from 1.7 V (dotted line (d) in FIG. 3) to 1.3 V (dotted line (c) in FIG. 3), for example, a gain of the amplifier decreases largely and, when common-mode voltage Vcom becomes lower than a prescribed voltage flowing through the MOS transistors as current sources increases but, when common-mode voltage Vcom decreases from the prescribed voltage (e.g., ordinary operative voltage of 1.5 V.), the amplifier does not function as an operational amplifier. Thus, the prior art operational amplifier largely depends on common-mode input voltage Vcom, so that an operative margin of the operational amplifier cannot be large.

On the other hand, according to the first embodiment of the present invention, however, even when common-mode voltage Vcom of positive and negative side voltages Vin+ and Vin− of the operational amplifier changes from 1.7 V (solid line (b) in FIG. 3) to 1.3 V (solid line (a) in FIG. 3), for example, a decrease in gain of the operational amplifier can be suppressed. Thus, the operational amplifier does not largely depend on common-mode input voltage Vcom, so that a large operative margin of the operational amplifier can be obtained.

As described above, operational amplifier 1 of the first embodiment of the present invention is provided with differential amplifier 2, replica amplifier 3 that is the same in structure as differential amplifier 2 and includes P-channel MOS transistors PT11 and PT12 and N-channel MOS transistors NT11, NT12 and NT13, voltage-current converting circuit 4 that receives positive and negative side output voltages Voutr+ and Voutr− from replica amplifier 3 and supplies voltage-current converted output current Irep and comparator 6 that receives output current Irep from voltage-current converting circuit 4 and reference current Iref from reference current source 5 and supplies a differential current as a compared current Ico to differential amplifier 2.

Thus, when common-mode voltage Vcom of operational amplifier 1 increases, only an increment of bias current Ibias is provided from node N3 of differential amplifier 2 to comparator 6 and, when common-mode voltage Vcom decreases, a decrement of bias current Ibias is provided from comparator 6 to node N3 of differential amplifier 2. As a result, current flowing from N-channel MOS transistor NT3 as a current source to low voltage power source Vss can be substantially kept constant.

Thus, dependence of the first embodiment of the present invention on common-mode input voltage Vcom can be less than that of the prior art operational amplifier. Further, since a changed component of bias current Ibias is supplied to comparator 6 in response to that of the common-mode input voltage, dependence of the first embodiment of the present invention on a power source voltage can be less than that on the prior art operational amplifier, so that an operative margin of the former can be made larger than that of the latter.

Although operational amplifier 1 of the first embodiment of the present invention is composed of MOS transistors, the same may be composed of bipolar transistors or BiCMOS circuits. In addition, one-stage differential amplifier circuits of differential amplifier 2 and replica amplifier 3 may be replaced with two-stage differential amplifier circuits or three-stage differential amplifier circuits with input, amplifying and output stages. Further, the MOS transistors in the first embodiment of the present invention that have the gate insulating films made of silicon oxide films, may be replaced with MIS transistors that have gate insulating films made of $SiN_xO_y$ films into which silicon oxide films are thermally nitrided, silicon nitride ($Si_3N_4$)/silicon oxide stacked films or high dielectric films (high-K gate insulating films), etc.

Second Embodiment

Figure 4:
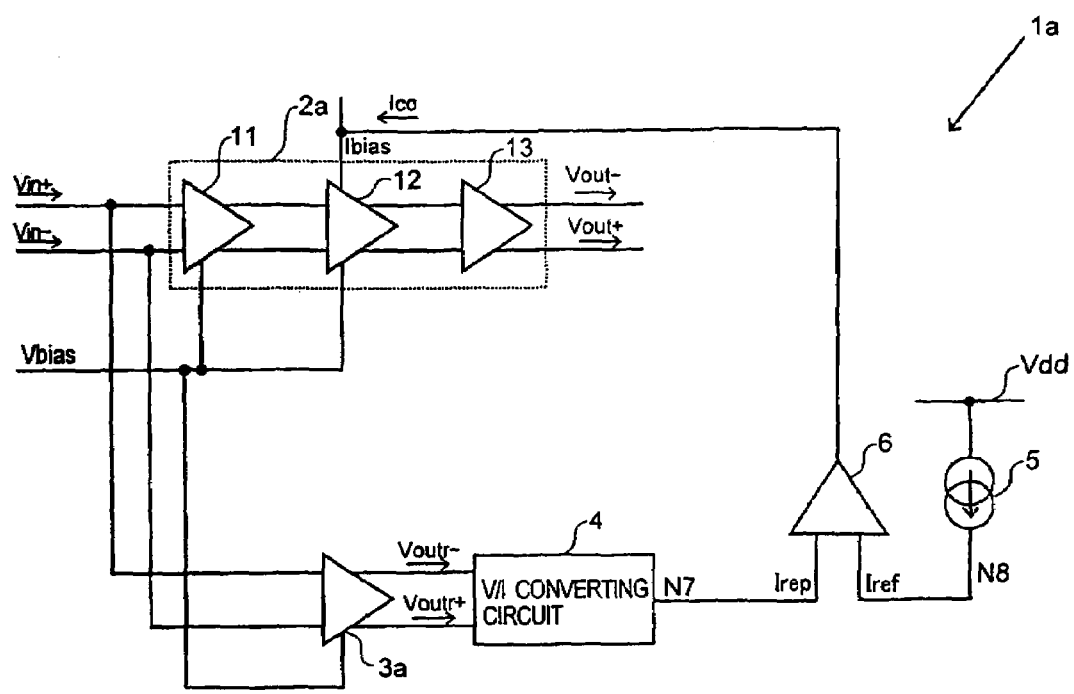
FIG. 4 is a circuit diagram to show an operational amplifier in accordance with a second embodiment of the present invention.
Figure 5:
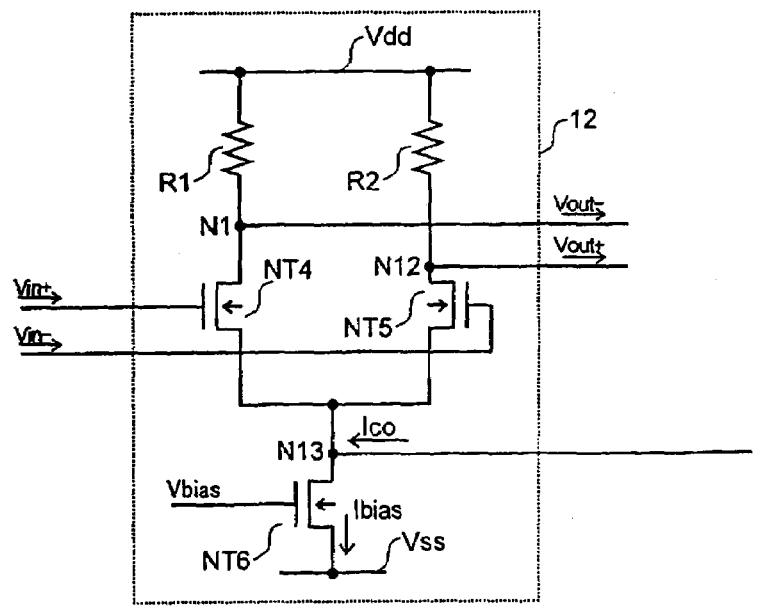
FIG. 5 is a circuit diagram of an amplifier in the operational amplifier shown in FIG. 4.
Figure 6:
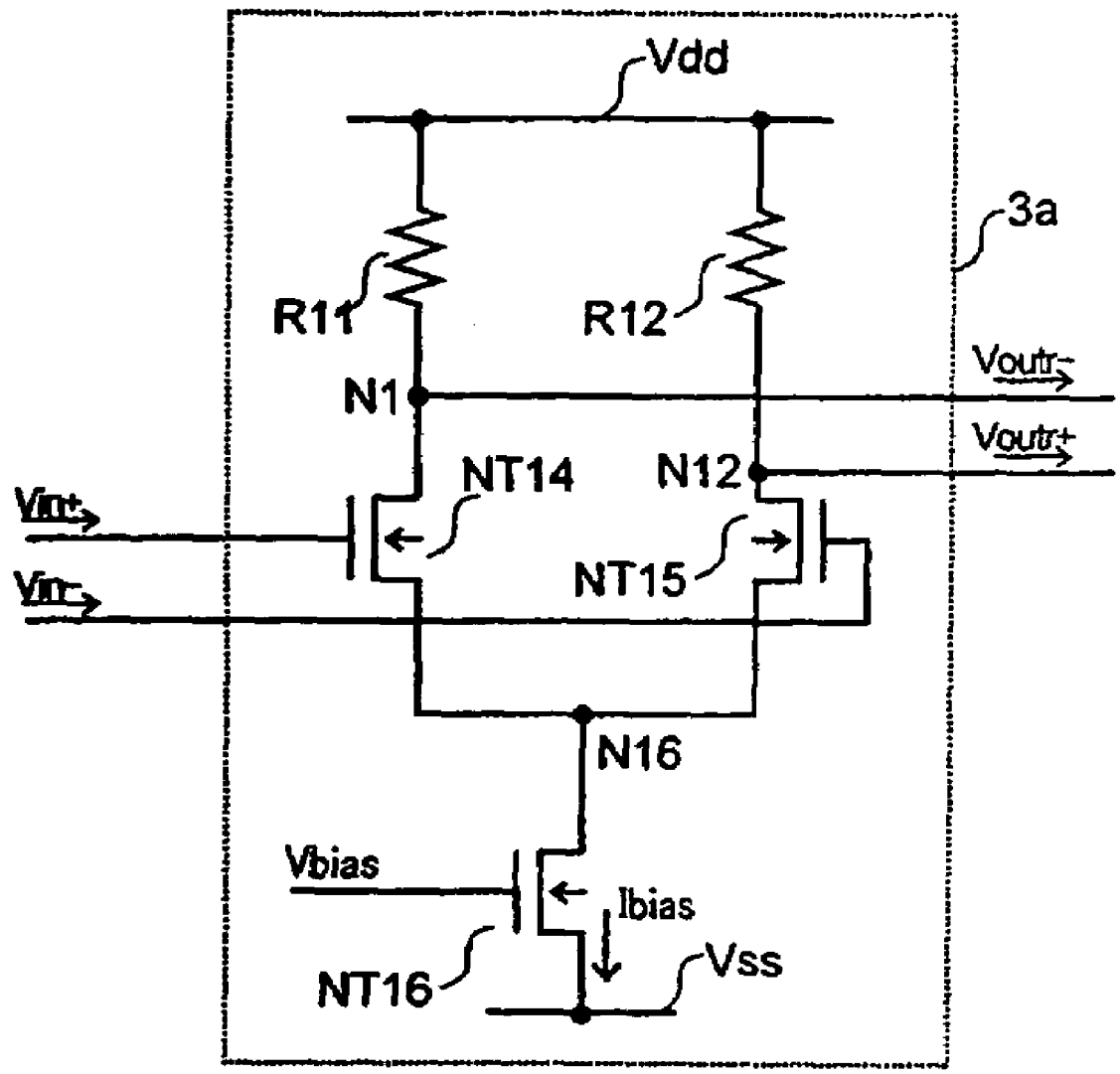
FIG. 6 is a circuit diagram of a replica amplifier in the operational amplifier shown in FIG. 4.

An operational amplifier in accordance with the second embodiment of the present invention will be explained below with reference to the attached drawings. FIG. 4 is a circuit diagram of the operational amplifier. FIG. 5 is a circuit diagram of an amplifying stage in the operational amplifier. FIG. 6 is a circuit diagram of a replica amplifier of the operational amplifier. As will be set forth in detail, a differential amplifier is composed of three stages: an input stage, an amplifying stage and an output stage while a replica amplifier is a one-stage amplifier.

Since similar or same reference numerals of components in the second embodiment show similar, equivalent or same ones in the first embodiment, those different from the components in the first embodiment will be primarily explained below.

As shown in FIG. 4, operational amplifier 1a includes differential amplifier 2a, replica amplifier 3a, voltage-current converting circuit 4, reference current source 5 and comparator 6.

Differential amplifier 2a has three stages of input stage 11, amplifying stage 12 and output stage 13. Input stage 11 is composed of a differential amplifier that receives positive and negative side input voltages Vin+ and Vin−, amplifies the same and provides an output signal. Amplifying stage 12 is supplied with the output signal from input stage 11 and amplifies the signal. Amplifying stage 12 is also supplied with compared current Ico from comparator 6 to keep bias current Ibias constant. Further, output stage 13 is supplied with the output signal from the amplifying stage 12 and amplifies the signal.

Replica amplifier 3a receives positive and negative side input voltages Vin+ and Vin− and amplifies the input voltages.

Voltage-current converting circuit 4 provided between replica amplifier 3a and comparator 6 receives amplified positive and negative side input voltages Voutr+ and Voutr− and supplies voltage-current converted output current Irep to node N7.

Comparator 6 is provided between voltage-current converting circuit 4 and reference current source 5 on an input side and amplifying stage 12 on an output side. Comparator 6 receives output current Irep from voltage-current converting circuit 4 and reference current Iref, calculates a difference between output current Irep and reference current Iref and supplies compared current Ico as a difference current between currents Irep and Iref.

As shown in FIG. 5, amplifying stage 12 is a differential amplifier circuit that includes resisters R1 and R2, and N-channel MOS transistors NT4, NT5 and NT6.

Resistor R1 is connected to high voltage power source Vdd at its one end and node N11 at its other end to supply a current N-channel MOS transistor NT4.

Resistor R2 is connected to high voltage power source Vdd at its one end and node N12 at its other end to supply a current N-channel MOS transistor NT5.

N-channel MOS transistor NT4 has drain, source and gate electrodes. The drain, source and gate electrodes of MOS transistor NT4 are connected to nodes N11, N13 and negative side input voltage Vin−, respectively. N-channel MOS transistor NT5 also has drain, source and gate electrodes. The drain, source and gate electrodes of MOS transistor NT5 are connected to nodes N12, N13 and positive side input voltage Vin+, respectively. N-channel MOS transistors NT4 and NT5 constitutes a differential amplifier pair while positive and negative side input voltages Vin− and Vin+ are reversed in phase.

N-channel MOS transistor NT6 has drain, source and gate electrodes. The drain, source and gate electrodes of MOS transistor NT6 are connected to node N13, low voltage power source Vss and bias voltage Vbias from a bias circuit. Node N13 is supplied with compared current Ico output from comparator 6.

Now, when the gate electrode of N-channel MOS transistor NT6 is supplied with bias voltage Vbias, N-channel MOS transistor NT6 functions as a current source that supplies bias current Ibias from node N13 through low voltage power source Vss and amplifying stage 12 operates. Amplifying stage 12 provides nodes N11 and N12 with amplified positive side output voltage Vout+ and amplified negative side output voltage Vout−, respectively. Here, bias current Ibias is controlled in level in response to compared current Ico, so that bias current Ibias is kept constant. When no vias voltage Vbias is applied to the gate electrode of MOS transistor NT6, amplifying stage 12 stops its operation.

As shown in FIG. 6, replica amplifier 3a is a differential amplifier circuit that includes resistors R11 and R12, and N-channel MOS transistors NT14, NT15 and NT16.

Resistor R11 is connected to high voltage power source Vdd at its one end and node N14 at its other end to supply a current N-channel MOS transistor NT14 as a load.

Resistor R12 is connected to high voltage power source Vdd at its one end and node N15 at its other end to supply a current N-channel MOS transistor NT15 as a load.

N-channel MOS transistor NT14 has drain, source and gate electrodes. The drain, source and gate electrodes of MOS transistor NT14 are connected to nodes N14, N16 and positive side input voltage Vin+, respectively. N-channel MOS transistor NT15 also has drain, source and gate electrodes. The drain, source and gate electrodes of MOS transistor NT15 are connected to nodes N15, N16 and negative side input voltage Vin−, respectively. N-channel MOS transistors NT14 and NT15 constitutes a differential amplifier pair.

N-channel MOS transistor NT16 has drain, source and gate electrodes. The drain, source and gate electrodes of MOS transistor NT16 are connected to node N16, low voltage power source Vss and bias voltage Vbias from a bias circuit.

When the gate electrode of N-channel MOS transistor NT16 is supplied with bias voltage Vbias, N-channel MOS transistor NT16 functions as a current source that supplies bias current Ibiasr from node N16 through low voltage power source Vss and replica amplifier 3a operates. Replica amplifier 3a provides nodes N14 and N15 with amplified negative side output voltage Vout− and amplified positive side output voltage Vout+, respectively. When no vias voltage Vbias is applied to the gate electrode of MOS transistor NT16, replica amplifier 3a stop its operation.

Here, replica amplifier 3a is identical in structure to amplifying stage 12 but the gate electrode lengths and widths of the transistors may be different from each other. In order to achieve high-speed operations, the gate electrodes of the transistors provided in amplifying stage 12 and replica amplifier 3a are preferably short in length. Bias current Ibiasr as well as the one Ibias are subjected in value to production process fluctuations, such as dispersion of gate electrode lengths of the transistors, but bias currents Ibiasr and Ibias are not necessarily set to be consistent in value with each other.

As described above, operational amplifier 1a of the second embodiment of the present invention includes differential amplifier 2, replica amplifier 3a, voltage-current converting circuit 4, reference current source 5 and comparator 6. Replica amplifier 3a is identical in structure to amplifying stage 12 of differential amplifier 2 and that includes resistors R11 and R12 and N-channel MOS transistors NT14, NT15 and NT16. Voltage-current converting circuit 4 receives positive and negative side output voltages Voutr+ and Voutr− from replica amplifier 3a and supplies voltage-current converted output current Irep. Comparator 6 receives output current Irep from voltage-current converting circuit 4 and reference current Iref from reference current source 5 and supplies a differential current as a compared current Ico to amplifying stage 12 of differential amplifier 2.

Thus, when common-mode voltage Vcom of operational amplifier 1a increases, only an increment of bias current Ibias is provided from amplifying stage 12 to comparator 6. On the other hand, when common-mode voltage Vcom decreases, a decrement of bias current Ibias is provided from comparator 6 to amplifying stage 12. As a result, current flowing from N-channel MOS transistor NT6 as a current source to low voltage power source Vss can be substantially kept constant.

Thus, dependence of the second embodiment of the present invention on common-mode input voltage Vcom also can be less than that of the prior art operational amplifier. An operative margin of the former can be larger than the latter. Further, since only changed components of bias current Ibias are supplied from comparator 6 to amplifying stage 12 even when power source voltages are changed, dependence of the second embodiment of the present invention on power source voltages can be less than that on the prior art operational amplifier, so that an operative margin of the former can be made larger than that of the latter. In addition, since differential amplifier 2a has input stage 11, amplifying stage 12 and output stage 13, a gain of differential amplifier 2a is much larger than that of differential amplifier 2 of the first embodiment.

The present invention is not limited to the embodiments set forth above. There are various modifications and changes without departing from the scope of the present invention.

For example, although operational amplifier 1a of the second embodiment of the present invention includes three-stage differential amplifier 2a, i.e., input, amplifying and output stages, and one-stage replica amplifier 3a in the second embodiment, replica amplifier 3a may be replaced with a two-stage structure, i.e., input and amplifying stages, while the input stage of replica amplifier 3a can be commonly used with that of differential amplifier 2a. Alternatively, differential amplifier 2a and replica amplifier 3a may be M-stage and one stage amplifiers, respectively, in which the (M−1)th stage is identical to replica amplifier 3a. Further, differential circuit pairs of the N-channel MOS transistors in the embodiments of the present invention may be replaced with applications of pail-to-rail operational amplifiers composed of differential pairs of N-channel and P-channel MOS transistors.

OTHER MODIFICATIONS

The present invention includes the following modifications.

(First Modification) An operational amplifier includes an amplifier, a replica amplifier, a current mirror circuit and a comparator. The amplifier has a differential pair of first and second transistors and a first current source. The first and second transistors are provided on a side of a high voltage power source and their control electrode are supplied with reverse phases of positive and negative side input signals, respectively. The first current source is provided between the first and second transistors and a low voltage power source and generates a bias current. The replica amplifier has a differential pair of third and fourth transistors and a second current source. The third and fourth transistors are provided on the side of the high voltage power source and their control electrode are supplied with the positive and negative side input signals, respectively. The second current source is provided between the third and fourth transistors and the low voltage power source and generates a bias current. The current mirror circuit receives positive and negative side signals amplified and output by the replica amplifier, carries out voltage-current converting of the same, and supplies output currents to the comparator. The comparator receives the output currents from the current mirror circuit, calculates a differential current between the output currents and a reference current, and supplies the differential current to the first current source, so that the bias current of the first current source can be controlled.

(Second Modification) The first through fourth transistors and the first and second current sources of the operational amplifier in the first modification are composed of NPN transistors while base electrodes of the current source NPN transistors are supplied with bias voltages.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. An operational amplifier comprising:
   an amplifier including a differential pair of first and second transistors and a first current source,
   the first and second transistors being provided on a side of a high voltage power source and their control electrodes receiving mutually reversed phase, positive and negative side input voltages, respectively,
   the first current source being provided between the first and second transistors and a low voltage power source to generate a first bias current;
   a replica amplifier including a differential pair of third and fourth transistors and a second current source,
   the third and fourth transistors being provided on the side of the high voltage power source and their control electrodes receiving the positive and negative side input voltages, respectively,
   the second current source being provided between the third and fourth transistors and the low voltage power source;
   a voltage-current converting circuit supplied with positive and negative side voltages output from the replica amplifier,
   the voltage-current converting circuit converting the positive and negative side voltages to output currents; and
   a bias current control circuit that receives the output currents from the voltage-current converting circuit, generates a differential current between the output currents and a reference current and supplies the differential current to the first current source to control the first bias current.

2. An operational amplifier according to claim 1, wherein the first through fourth transistors are N-channel MOS transistors and the first and second current sources are N-channel MOS transistors, gate electrodes of which are supplied with bias voltages.

3. An operational amplifier according to claim 1, wherein the bias current control circuit is a comparator.

4. An operational amplifier according to claim 1, wherein the first through fourth transistors are NPN transistors and the first and second current sources are NPN transistors, gate electrodes of which are supplied with bias voltages.

5. An operational amplifier according to claim 1, wherein the first through fourth transistors are NPN transistors and the first and second current sources are NPN transistors, gate electrodes of which are supplied with bias voltages.

6. An operational amplifier comprising:
   M-stage differential amplifier circuits M≧2, each of which includes a differential pair of first and second transistors and a (M−1)th stage differential amplifier circuit of which further includes a first current source,
   the first and second transistors being provided on a side of a high voltage power source and their control electrodes receiving mutually reversed phase, positive and negative side input voltages, respectively,
   the first current source being provided between the first and second transistors and a low voltage power source to generate a first bias current;
   a replica amplifier including a differential pair of third and fourth transistors and a second current source,
   the third and fourth transistors being provided on the side of the high voltage power source and their control electrodes receiving the positive and negative side input voltages, respectively,
   the second current source being provided between the third and fourth transistors and the low voltage power source;
   a voltage-current converting circuit supplied with positive and negative side voltages output from the replica amplifier,
   the voltage-current converting circuit converting the positive and negative side voltages to output currents; and
   a bias current control circuit that receives the output currents from the voltage-current converting circuit, generates a differential current between the output currents and a reference current and supplies the differential current to the first current source to control the first bias current.

7. An operational amplifier according to claim 6, wherein the first through fourth transistors are N-channel MOS transistors and the first and second current sources are N-channel MOS transistors, gate electrodes of which are supplied with bias voltages.

8. An operational amplifier according to claim 6, wherein the bias current control circuit is a comparator.

9. An operational amplifier according to claim 6, wherein the first through fourth transistors are NPN transistors and the first and second current sources are NPN transistors, gate electrodes of which are supplied with bias voltages.

10. An operational amplifier comprising:
M-stage differential amplifier circuits M≧2, each of which includes a differential pair of first and second transistors and a (M−1)th stage differential amplifier circuit of which further includes a first current source,
the first and second transistors being provided on a side of a high voltage power source and their control electrodes receiving mutually reversed phase, positive and negative side input voltages, respectively,
the first current source being provided between the first and second transistors and a low voltage power source to generate a first bias current;
(M−1)-stage replica amplifiers, each of which includes a differential pair of third and fourth transistors and a second current source,
the third and fourth transistors being provided on the side of the high voltage power source and their control electrodes receiving the positive and negative side input voltages, respectively,
the second current source being provided between the third and fourth transistors and the low voltage power source;
a voltage-current converting circuit supplied with positive and negative side voltages output from the replica amplifier,
the voltage-current converting circuit converting the positive and negative side voltages to output currents; and
a bias current control circuit that receives the output currents from the voltage-current converting circuit, generates a differential current between the output currents and a reference current and supplies the differential current to the first current source to control the first bias current.

11. An operational amplifier according to claim 10, wherein the first through fourth transistors are N-channel MOS transistors and the first and second current sources are N-channel MOS transistors, gate electrodes of which are supplied with bias voltages.

12. An operational amplifier according to claim 10, wherein the bias current control circuit is a comparator.

13. An operational amplifier according to claim 10, wherein the first through fourth transistors are NPN transistors and the first and second current sources are NPN transistors, gate electrodes of which are supplied with bias voltages.

14. An operational amplifier comprising:
an amplifier including a differential pair of first and second transistors and a first current source,
the first and second transistors being provided on a side of a high voltage power source and their control electrodes receiving mutually reversed phase, positive and negative side input voltages, respectively,
the first current source being provided between the first and second transistors and a low voltage power source to generate a first bias current;
a replica amplifier including a differential pair of third and fourth transistors and a second current source,
the third and fourth transistors being provided on the side of the high voltage power source and their control electrodes receiving the positive and negative side input voltages, respectively,
the second current source being provided between the third and fourth transistors and the low voltage power source;
a current mirror circuit supplied with positive and negative side voltages output from the replica amplifier,
the current mirror circuit converting the positive and negative side voltages to output currents; and
a bias current control circuit that receives the output currents from the current mirror circuit, generates a differential current between the output currents and a reference current and supplies the differential current to the first current source to control the first bias current.

15. An operational amplifier according to claim 14, wherein the first through fourth transistors are N-channel MOS transistors and the first and second current sources are N-channel MOS transistors, gate electrodes of which are supplied with bias voltages.

16. An operational amplifier according to claim 14, wherein the bias current control circuit is a comparator.

* * * * *